United States Patent
Lim et al.

(10) Patent No.: US 10,224,432 B2
(45) Date of Patent: Mar. 5, 2019

(54) SURFACE TREATMENT PROCESS PERFORMED ON DEVICES FOR TFT APPLICATIONS

(71) Applicant: Applied Materials, Inc., Santa Clara, CA (US)

(72) Inventors: Rodney Shunleong Lim, Daly City, CA (US); Dong-Kil Yim, Pleasanton, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/456,418

(22) Filed: Mar. 10, 2017

(65) Prior Publication Data

US 2018/0261698 A1 Sep. 13, 2018

(51) Int. Cl.
| | |
|---|---|
| *H01L 29/78* | (2006.01) |
| *H01L 29/786* | (2006.01) |
| *H01L 21/223* | (2006.01) |
| *H01L 21/423* | (2006.01) |
| *H01L 29/20* | (2006.01) |
| *H01L 29/207* | (2006.01) |
| *H01L 29/24* | (2006.01) |

(Continued)

(52) U.S. Cl.
CPC ...... *H01L 29/7869* (2013.01); *H01L 21/2233* (2013.01); *H01L 21/2236* (2013.01); *H01L 21/423* (2013.01); *H01L 29/2003* (2013.01); *H01L 29/207* (2013.01); *H01L 29/24* (2013.01); *H01L 29/4908* (2013.01); *H01L 29/66522* (2013.01); *H01L 29/66742* (2013.01); *H01L 29/66969* (2013.01); *H01L 29/78681* (2013.01)

(58) Field of Classification Search
CPC ...................................................... H01L 27/12
See application file for complete search history.

(56) References Cited

U.S. PATENT DOCUMENTS

| | | |
|---|---|---|
| 6,620,719 B1 | 9/2003 | Andry et al. |
| 6,716,658 B2 | 4/2004 | Park |
| 7,812,346 B2 | 10/2010 | Shieh et al. |

(Continued)

FOREIGN PATENT DOCUMENTS

| | | |
|---|---|---|
| CN | 103456793 A | 12/2013 |
| WO | 2017039436 A1 | 3/2017 |

OTHER PUBLICATIONS

International Search Report and Written Opinion for PCT/US2018/017416 dated Apr. 30, 2018.

(Continued)

*Primary Examiner* — Caridad Everhart
*Assistant Examiner* — Ankush Singal
(74) *Attorney, Agent, or Firm* — Patterson + Sheridan, LLP

(57) ABSTRACT

Embodiments of the disclosure generally provide methods of forming thin film transistor (TFT) device structure with good interface management between active layers of a metal electrode layer and/or source/drain electrode layers and a nearby insulating material so as to provide high electrical performance devices, or for other suitable display applications. In one embodiment, a thin film transistor structure includes a contact region formed between fluorine-doped source and drain regions disposed on a substrate, a gate insulating layer disposed on the contact region, and a metal electrode layer disposed on the gate insulator layer.

10 Claims, 4 Drawing Sheets

(51) Int. Cl.
*H01L 29/49* (2006.01)
*H01L 29/66* (2006.01)

(56) References Cited

U.S. PATENT DOCUMENTS

| | | | | |
|---|---|---|---|---|
| 8,354,670 B2* | 1/2013 | Kim | ................ | H01L 29/4908 |
| | | | | 257/43 |
| 9,012,994 B2* | 4/2015 | Jung | ................ | H01L 27/1225 |
| | | | | 257/347 |
| 9,245,957 B2* | 1/2016 | Kim | ................ | H01L 29/7869 |
| 9,726,940 B2* | 8/2017 | Tomiyasu | ............ | G02F 1/13394 |
| 9,735,283 B2* | 8/2017 | Ou | ................ | H01L 29/7869 |
| 2007/0032054 A1* | 2/2007 | Ramaswamy | .......... | C23C 16/26 |
| | | | | 438/513 |
| 2012/0064686 A1* | 3/2012 | Farber | ................ | H01L 21/3065 |
| | | | | 438/285 |
| 2012/0168757 A1* | 7/2012 | Park | ................ | H01L 29/7869 |
| | | | | 257/59 |
| 2013/0037798 A1 | 2/2013 | Wong et al. | | |
| 2013/0143378 A1* | 6/2013 | Park | ................ | H01L 21/02532 |
| | | | | 438/308 |
| 2014/0319555 A1* | 10/2014 | Prushinskiy | ...... | H01L 29/42384 |
| | | | | 257/91 |
| 2015/0069378 A1* | 3/2015 | Cha | ................ | H01L 27/1225 |
| | | | | 257/43 |
| 2016/0327825 A1* | 11/2016 | Tomiyasu | ............ | G02F 1/13394 |
| 2017/0207327 A1* | 7/2017 | Hsu | ................ | H01L 21/02565 |

OTHER PUBLICATIONS

Office Action from Taiwan Patent Application No. 107107904 dated Dec. 5, 2018.

* cited by examiner

SURFACE TREATMENT PROCESS PERFORMED ON DEVICES FOR TFT APPLICATIONS

BACKGROUND

Field

Embodiments of the present disclosure generally relate to, thin film transistor (TFT) device structures and methods for performing a surface treatment process between an insulating layer and a metal electrode layer and/or source/drain electrodes in TFT device structures.

Description of the Related Art

Display devices have been widely used for a wide range of electronic applications, such as TV, monitors, mobile phone, MP3 players, e-book readers, and personal digital assistants (PDAs) and the like. The display device is generally designed for producing desired image by applying an electric field to a liquid crystal that fills a gap between two substrates and has anisotropic dielectric constant that controls the intensity of the dielectric field. By adjusting the amount of light transmitted through the substrates, the light and image intensity, quality and power consumption may be efficiently controlled.

A variety of different display devices, such as active matrix liquid crystal display (AMLCD) or an active matrix organic light emitting diodes (AMOLED), may be employed as light sources for display devices which utilize touch screen panels. In the manufacturing of TFT devices, an electronic device with high electron mobility, low leakage current and high breakdown voltage, would allow more pixel area for light transmission and integration of circuitry, thus resulting in a brighter display, higher overall electrical efficiency, faster response time and higher resolution displays. Low film qualities of the material layers, such as metal electrode layer with impurities, formed in the device often result in poor device electrical performance and short service life of the devices. Thus, a stable and reliable method for forming and integrating film layers with in a TFT devices becomes crucial to provide a device structure with low film leakage, and high breakdown voltage, for use in manufacturing electronic devices with lower threshold voltage shift and improved the overall performance of the electronic device are desired. In particular, the interface management between a metal electrode layer and the nearby insulating materials becomes critical as improper material selection of the interface between the metal electrode layer, or the source/drain electrodes and the nearby insulating material may adversely result in undesired elements diffusing into the adjacent materials, which may eventually lead to current short, current leakage or device failure.

Therefore, there is a need for improved TFT device structures and methods for good interface management for manufacturing TFT devices that produce improved device electrical performance and device stability.

SUMMARY

Embodiments of the disclosure generally provide thin film transistor (TFT) device structures and methods of forming TFT device structures with good interface management between a metal electrode layer or a source/drain electrode and a nearby insulating material layer so as to provide high electrical performance devices, or for other suitable display applications. In one embodiment, a thin film transistor structure includes a contact region formed between fluorine-doped source and drain regions disposed on a substrate, a gate insulating layer disposed on the contact region, and a metal electrode layer disposed on the gate insulator layer.

In another embodiment, a method for forming a thin film structure with enhanced electrical performance includes performing a surface treatment process by supplying a surface treatment gas mixture onto a substrate having source and drain regions formed and exposed thereon, wherein the surface treatment gas mixture includes at least a fluorine containing gas, and providing a remote plasma power to the surface treatment gas mixture from a remote plasma source disposed in a processing chamber while performing the surface treatment process.

In yet another embodiment, a method for forming a thin film structure with enhanced electrical performance includes performing a surface treatment process on a substrate having source and drain regions formed and exposed thereon, wherein the source and drain regions are fabricated by IGZO material, wherein performing the surface treatment process includes (A) supplying a surface treatment gas mixture into a processing chamber where the substrate is disposed into, (B) applying a remote plasma power to the surface treatment gas mixture supplied to the processing chamber to form a remote plasma in the processing chamber to incorporate fluorine elements into the source and drain regions, and (C) forming fluorine-doped source and drain regions on the substrate.

BRIEF DESCRIPTION OF THE DRAWINGS

So that the manner in which the above recited features of the present disclosure are attained and can be understood in detail, a more particular description of the disclosure, briefly summarized above, may be had by reference to the embodiments thereof which are illustrated in the appended drawings.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this disclosure and are therefore not to be considered limiting of its scope, for the disclosure may admit to other equally effective embodiments.

DETAILED DESCRIPTION

Embodiments of the disclosure generally provide a TFT device structures and methods of performing a surface treatment process on an active layer of source, drain and contact regions in the TFT device structures so as to enhance electrical performance for display devices. The surface treatment process may densify the active layer film properties of the metal electrodes, source/drain and/or contact regions, and/or film layers on the substrate. In one example, the surface treatment process is performed to provide fluorine elements to a metal electrode layer (e.g., a metal gate electrode, a source-drain and/or contact regions or electrode layers, or other suitable metal structures) prior to an insulating layer (e.g., a passivation layer, an interlayer insulator, an inter-connection material, or other dielectric material) is formed on the electrodes of the TFT devices. The surface treatment process may densify the active layer film structures to provide good interface management and thermal stabilization during thermal cycles of the manufacturing operation so as to prevent elements either from the insulating layer or from the metal electrode layer from cross contaminating or/and diffusion phenomenon to each other. Thus, proper interface film properties by providing an enhanced interface control of metal electrodes and active layers of source/drain and/or contact regions in display devices may efficiently enhance the electrical performance of transistor and diode devices.

Figure 1:
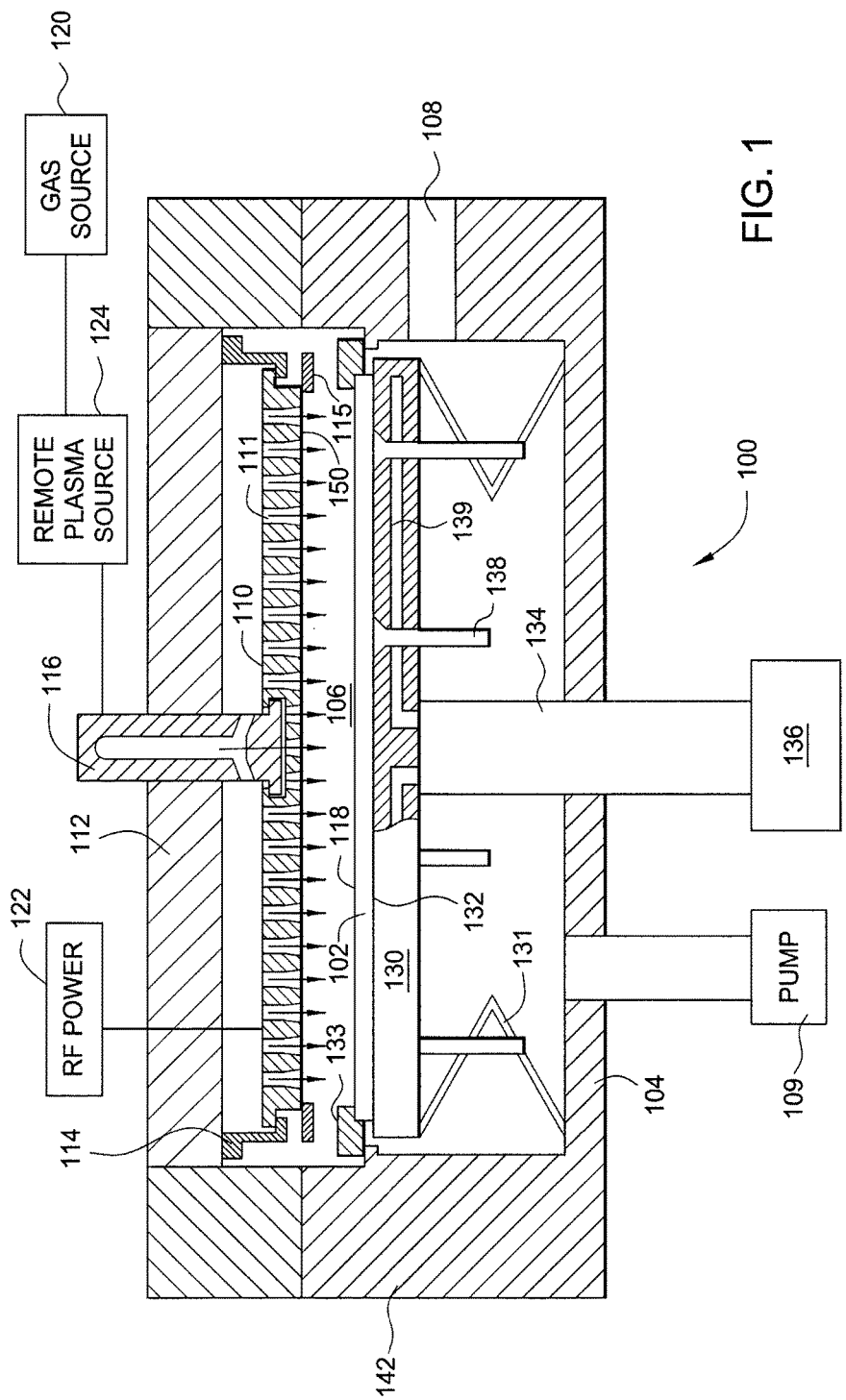
FIG. 1 depicts a sectional view of the processing chamber that may be used to perform a treatment process in accordance with one embodiment of the present disclosure.

FIG. 1 is a schematic cross-section view of one embodiment of a plasma enhanced chemical vapor deposition (PECVD) chamber (processing chamber) 100 in which a surface treatment process may be performed and an insulating layer, such as a silicon containing layer, an interlayer insulator, gate insulator or passivation layer in a TFT device structure, may be deposited. One suitable plasma enhanced chemical vapor deposition chamber is available from Applied Materials, Inc., located in Santa Clara, Calif. It is contemplated that other deposition chambers, including those from other manufacturers, may be utilized to practice the present disclosure.

The chamber 100 generally includes walls 142, a bottom 104 and a lid 112 which bound a process volume 106. A gas distribution plate 110 and substrate support assembly 130 which define a process volume 106. The process volume 106 is accessed through a valve 108 formed through the wall 142 such that a substrate 102 may be transferred in to and out of the chamber 100.

The substrate support assembly 130 includes a substrate receiving surface 132 for supporting the substrate 102 thereon. A stem 134 couples the substrate support assembly 130 to a lift system 136 which raises and lowers the substrate support assembly 130 between substrate transfer and processing positions. A shadow frame 133 may be optionally placed over periphery of the substrate 102 when processing to prevent deposition on the edge of the substrate 102. Lift pins 138 are moveably disposed through the substrate support assembly 130 and are adapted to space the substrate 102 from the substrate receiving surface 132 to facilitate robotic transfer of the substrate 102. The substrate support assembly 130 may also include heating and/or cooling elements 139 utilized to maintain the substrate support assembly 130 at a desired temperature. The substrate support assembly 130 may also include grounding straps 131 to provide an RF return path around the periphery of the substrate support assembly 130.

The gas distribution plate 110 is coupled at its periphery to a lid 112 or wall 142 of the chamber 100 by a suspension 114. The gas distribution plate 110 may also be coupled to the lid 112 by one or more center supports 116 to help prevent sag and/or control the straightness/curvature of the gas distribution plate 110. In one embodiment, the gas distribution plate 110 may have different configurations with different dimensions. In an exemplary embodiment, the gas distribution plate 110 has a quadrilateral plan shape. The gas distribution plate 110 has a downstream surface 150 having a plurality of apertures 111 formed therein facing an upper surface 118 of the substrate 102 disposed on the substrate support assembly 130. The apertures 111 may have different shape, numbers, densities, dimensions, and distributions across the gas distribution plate 110. In one embodiment, the diameter of the apertures 111 may be selected between about 0.01 inch and about 1 inch.

A gas source 120 is coupled to the lid 112 to provide gas through the lid 112, and then through the apertures 111 formed in the gas distribution plate 110 to the process volume 106. A vacuum pump 109 is coupled to the chamber 100 to maintain the gas in the process volume 106 at a desired pressure.

An RF power source 122 is coupled to the lid 112 and/or to the gas distribution plate 110 to provide a RF power that creates an electric field between the gas distribution plate 110 and the substrate support assembly 130 so that a plasma may be generated from the gases present between the gas distribution plate 110 and the substrate support assembly 130. The RF power may be applied at various RF frequencies. For example, RF power may be applied at a frequency between about 0.3 MHz and about 200 MHz. In one embodiment the RF power is provided at a frequency of 13.56 MHz.

In one embodiment, the edges of the downstream surface 150 of the gas distribution plate 110 may be curved so that a spacing gradient is defined between the edge and corners of the gas distribution plate 110 and substrate receiving surface 232 and, consequently, between the gas distribution plate 110 and the upper surface 118 of the substrate 102. The shape of the downstream surface 150 may be selected to meet specific process requirements. For example, the shape of the downstream surface 150 may be convex, planar, concave or other suitable shape. Therefore, the edge to corner spacing gradient may be utilized to tune the film property uniformity across the edge of the substrate, correcting property non-uniformity in the corner of the substrate. Additionally, the edge to center spacing may also be controlled so that the film property distribution uniformity may be controlled between the edge and center of the substrate. In one embodiment, a concave curved edge of the gas distribution plate 110 may be used so the center portion of the edge of the gas distribution plate 110 is spaced farther from the upper surface 118 of the substrate 102 than the corners of the gas distribution plate 110. In another embodiment, a convex curved edge of the gas distribution plate 110 may be used so that the corners of the gas distribution plate 110 are spaced farther than the edges of the gas distribution plate 110 from the upper surface 118 of the substrate 102.

A remote plasma source 124, such as an inductively coupled remote plasma source, may also be coupled between the gas source and the gas distribution plate 110. Between processing substrates, a cleaning gas may be energized in the remote plasma source 124 to remotely provide plasma utilized to clean chamber components. The cleaning gas may be further excited by the RF power provided to the gas distribution plate 110 by the power source 222. Suitable cleaning gases include, but are not limited to, $NF_3$, $F_2$, and $SF_6$.

In one embodiment, the substrate 102 that may be processed in the chamber 100 may have a surface area of 10,000 $cm^2$ or more, such as 25,000 $cm^2$ or more, for example about 55,000 $cm^2$ or more. It is understood that after processing the substrate 102 may be cut to form smaller other devices.

In one embodiment, the heating and/or cooling elements 139 may be set to provide a substrate support assembly temperature during deposition of about 600 degrees Celsius or less, for example between about 100 degrees Celsius and about 500 degrees Celsius, or between about 200 degrees Celsius and about 500 degrees Celsius, such as about 300 degrees Celsius and 500 degrees Celsius.

The nominal spacing during treatment between the upper surface 118 of the substrate 102 disposed on the substrate receiving surface 132 and the gas distribution plate 110 may generally vary between about 400 mil and about 1,200 mil, such as between about 400 mil and about 800 mil, or other distance across the gas distribution plate 110 to provide desired deposition results. In one exemplary embodiment wherein the gas distribution plate 110 has a concave downstream surface, the spacing between the center portion of the edge of the gas distribution plate 110 and the substrate receiving surface 132 is between about 400 mils and about 1400 mils and the spacing between the corners of the gas distribution plate 110 and the substrate receiving surface 132 is between about 300 mils and about 1200 mils.

Figure 4:
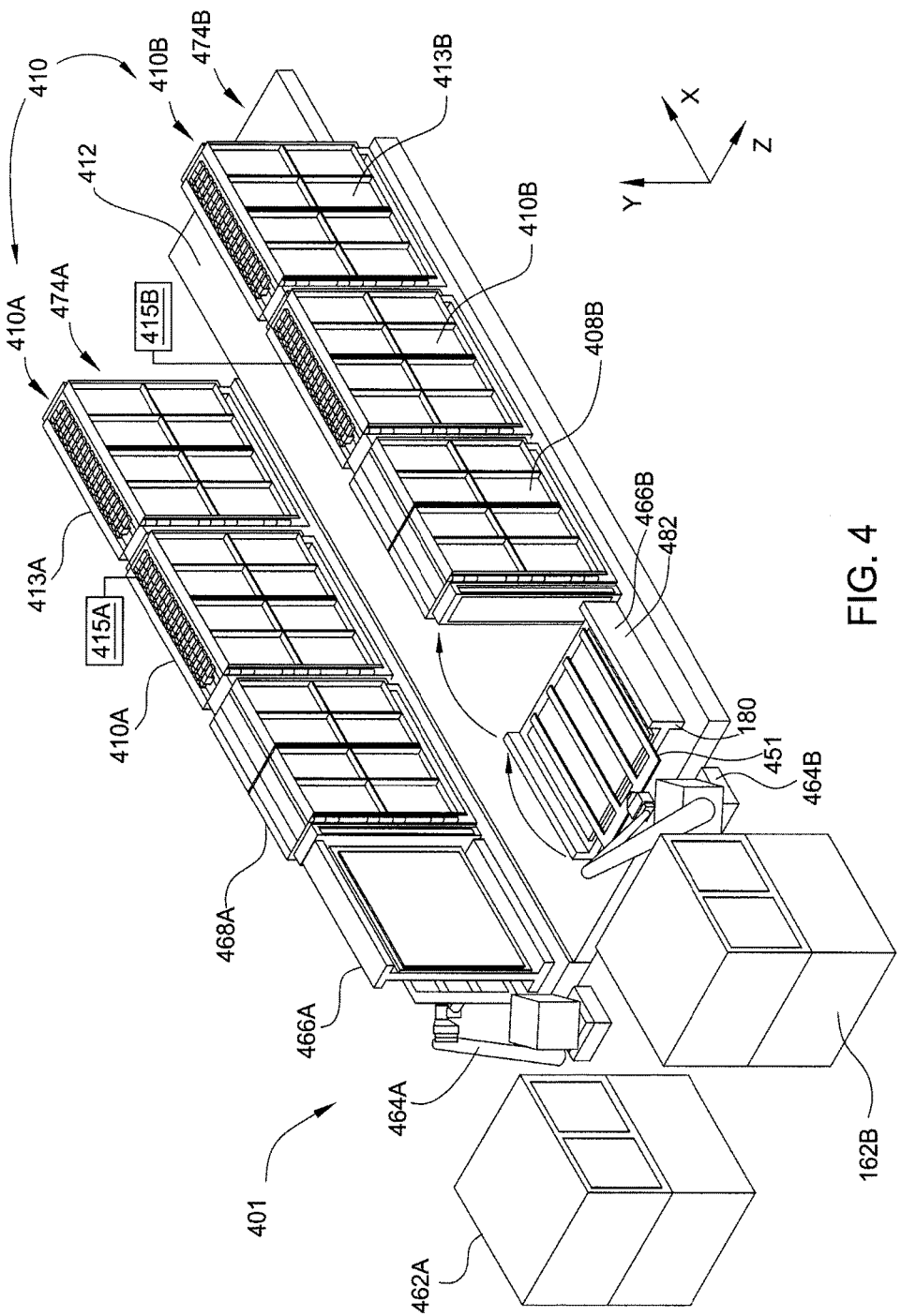
FIG. 4 is another example of a schematic representation of a processing system having a processing chamber may be used to perform a treatment process in accordance with one embodiment of the present disclosure.

Referring first to FIG. 4, FIG. 4 is a schematic representation of a vertical, linear processing system 401 that may include a processing chamber 410A, 410B, 413A, 413B that may also be utilized to perform the surface treatment process in accordance with one example of the disclosure. One suitable vertical, liner processing system is available from Pivot™ system from Applied Materials, Inc., located in Santa Clara, Calif.

The processing system 401 may be configured for deposition, etch, cleaning, pre-cleaning, implantation, annealing or other vacuum process. The system 401 may be sized to process substrates having a surface area of greater than about 90,000 mm² and, in some embodiments, be able to process more than 90 substrates per hour when depositing a 2,000 Angstrom thick material layer. The system 401 includes two separate process lines 474A, 474B coupled together by a common system control platform 462 to form a twin process line configuration/layout. A common power supply (such as an AC power supply), common and/or shared pumping and exhaust components and a common gas panel may be used for the twin process lines 474A, 474B. Each process line 474A, 474B may process more than 45 substrates per hour for a system total of greater than 90 substrates per hour. It is also contemplated that the system may be configured using a single process line or more than two process lines, and additionally that the system may be configured to process substrates of different sizes.

There are several benefits to the twin processing lines 474A, 474B for vertical substrate processing. Because the chambers of the processing system 401 are arranged vertically, the footprint of the system 401 is about the same as a single, conventional horizontal processing line. Thus, within approximately the same footprint, two processing lines 474A, 474B are present, which is beneficial to the manufacturer in conserving floor space in the fab. To help understand the meaning of the term "vertical", considering a flat panel display, the flat panel display, such as a computer monitor, has a length, a width and a thickness. When the flat panel display is vertical, either the length or width extends perpendicular from the ground plane while the thickness is parallel to the ground plane. Conversely, when a flat panel display is horizontal, both the length and width are parallel to the ground plane while the thickness is perpendicular to the ground plane. For large area substrates, the length and width are many times greater than the thickness of the substrate.

Each processing line 474A, 474B includes a substrate stacking module 462A, 462B from which fresh substrates (i.e., substrates which have not yet been processed within the system 401) are retrieved and processed substrates are stored. Atmospheric robots 464A, 464B retrieve substrates from the substrate stacking modules 462A, 462B and place the substrates into a dual substrate loading station 466A, 466B. It is to be understood that while the substrate stacking module 462A, 462B is shown having substrates stacked in a horizontal orientation, substrates disposed in the substrate stacking module 462A, 462B may be maintained in a vertical orientation similar to how the substrates are held in the dual substrate loading station 466A, 466B. The fresh substrates are then moved into dual substrate load lock chambers 468A, 468B and then to a first dual substrate processing chamber 410A, 410B (e.g., such as a pre-processing chamber or a pre-cleaning chamber) or further to a second dual substrate processing chamber 413A, 413B. A remote plasma source 415A, 415B may be formed and coupled to either or both of the first dual substrate processing chamber 410A, 410B and the second dual substrate processing chamber 413A, 413B. The substrate, now processed, then returns through one of the dual substrate load lock chambers 468A, 468B to one of the dual substrate loading stations 466A, 466B, where it is retrieved by one of the atmospheric robot 464A, 464B and returned to one of the substrate stacking modules 462A, 162B.

The sequence will be discussed in reference to both processing lines 474A, 474B at the same time even though a substrate goes down only one line. Each robot 464A, 464B may access both substrate loading stations 466A, 466B simultaneously or individually to pick up substrates. The robots 464A, 464B load substrates onto the substrate carrier 451 disposed on a support surface. In the embodiment of FIG. 4, the support surface is in the form of a flip table 480. The flip table 480 is configured to rotate the substrate carrier 451 approximately 90 degrees, for example, between a substantially horizontal and a substantially vertical orientation. The flip table 480 may include a flange 482 to retain the substrate carrier 451 when in the vertical position, and to allow connection between utilities and the substrate carrier 451 as further described below. The carrier 451 are disposed in the loading stations 466A, 466B and are configured to transfer substrates from the substrate stacking modules 462A, 462B to the load lock chamber 468A, 468B, and then to the processing chambers 410A, 410B and then optionally also to the processing chambers 413A, 413B.

During operation, the substrate carriers 451 are disposed in the loading stations 466A, 466B in a substantially horizontal or vertical orientation to receive substrates from the substrate stacking modules 462A, 462B. In the embodiment depicted in FIG. 4, the loading station 466A is shown in a substantially vertical orientation to receive a substrate that has been processed while on the substrate carrier 451 in the processing chamber 410A which is returning to the substrate stacking module 462A, while the loading station 466B is shown in horizontal orientation holding the substrate carrier 451 to receive a substrate to be processed in the processing chamber 410A from the substrate stacking modules 462B.

The substantially vertical substrate carriers 451 each having a substrate electrostatically chuck thereto, are transferred into the dual substrate load lock chambers 468A, 468B to be readied for transfer to the dual substrate processing chambers 410A, 410B and further to the processing chambers 413A, 413B as needed for further processing. The processing chambers 410A, 410B, 413A, 413B may be a pre-cleaning chamber, a pre-treatment chamber, chemical vapor deposition chamber, a physical vapor deposition chamber, an etch chamber, a plasma treatment chamber, an implantation chamber, an annealing chamber or other workpiece (i.e., substrate) processing chamber. After processing, the substrates disposed on the carriers 451 are then transferred back to the load lock chambers 468A, 408B, to the loading stations 466A, 466B. Once the processed substrates are loaded onto the loading stations 466A, 466B, the substrate carriers 451 are rotated to a substantially horizontal orientation to facilitate removal of the processed substrates therefrom and transfer of the processed substrates back to the substrate stacking modules 462A, 462B.

Figure 2:
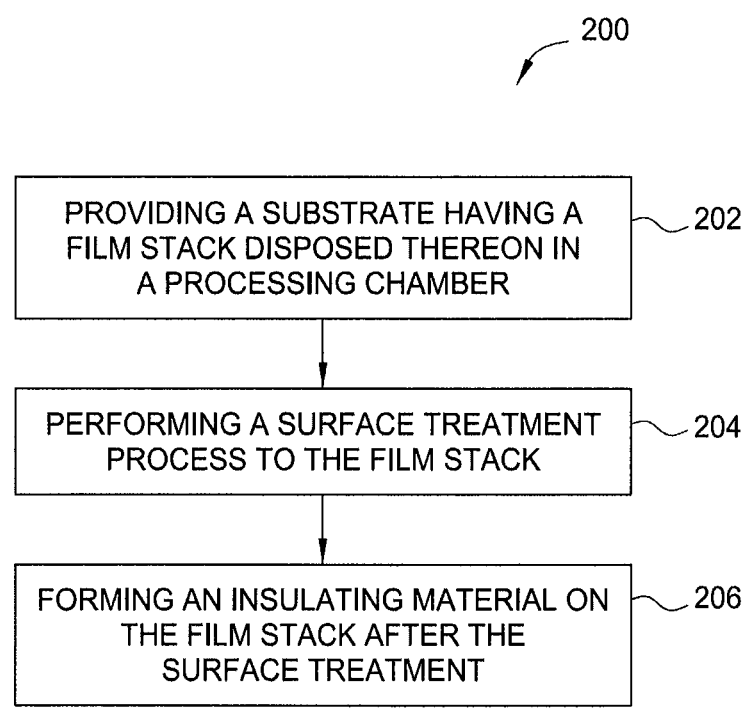
FIG. 2 depicts a process flow diagram of one embodiment of a method of performing a surface treatment process that may be used in a TFT device structure.

FIG. 2 depicts a flow diagram of one embodiment of a method 200 for performing a surface treatment process suitable for use in a thin-film transistor device. The process may be practiced in the processing chamber 100, as described in FIG. 1, or the processing chambers 410A, 410B, 413A, 413B, as described in FIG. 4, or other suitable processing chamber.

Figure 3A:
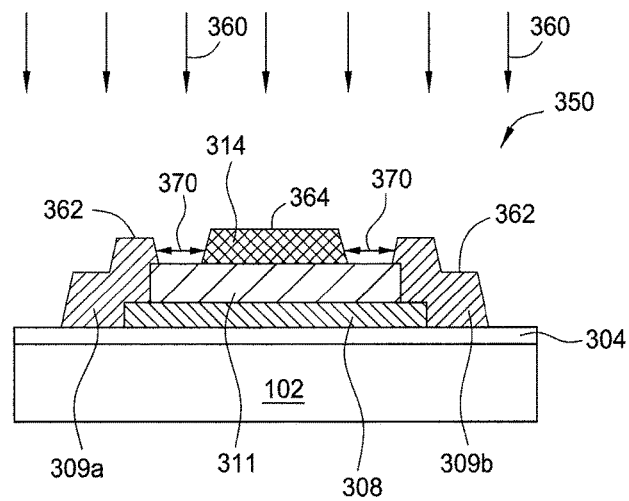
FIGS. 3A-3C are cross sectional views of one example of a thin film transistor device structure during different fabrication stages.

The method 200 begins at operation 202 by providing the substrate 102 in a process chamber, such as the processing chamber 100 depicted in FIG. 1, or the processing chamber 410A, 410B, (e.g., pre-treatment chamber) or 413A, 413B (e.g., plasma deposition chamber). The method 200 may be utilized to plasma treat a surface, such as surfaces of source/drain regions, contact regions or a metal electrode layer in a TFT device structure, which will be further described below with referenced to FIGS. 3A-3C. It is noted that the substrate 102 may have different combination of films, structures or layers previously formed thereon to facilitate forming different device structures or different film stack on the substrate 102. In one example, the substrate 102 may have a device structure 350 formed thereon, as shown in FIG. 3A. The substrate 102 may be any one of glass substrate, plastic substrate, polymer substrate, metal substrate, singled substrate, roll-to-roll substrate, or other suitable transparent substrate suitable for forming a thin film transistor thereon.

In one example depicted in FIG. 3, an example of a top gate TFT device structure 350 may be formed on the substrate 102. The top gate TFT device structures 350 are MOS devices built with active layer including a source region 309a, channel 308, and drain region 309b (e.g., or called metal contact regions, or source-drain metal contacts) formed on the optically transparent substrate 102, with or without an optional insulating layer 304 disposed thereon. In one example, the active layer including the source region 309a, channel region 308, and drain region 309b may be fabricated from a transparent metallic oxide material that has high electron mobility that is suitable low temperature manufacturing that allows flexible substrate materials, such as plastic materials, to be processed at a low temperature without substrate damage. Suitable examples of such materials that can be utilized for the source region 309a, channel region 308, and drain region 309b include a-IGZO (amorphous indium gallium zinc oxide), IGZO, InGaZnON, ZnO, ZnON, ZnSnO, CdSnO, GaSnO, TiSnO, CuAlO, SrCuO, LaCuOS, GaN, InGaN, AlGaN or InGaAlN, among others.

In another example wherein the top gate TFT device structure 350 is a top gate low temperature polysilicon (LTPS) TFT device structure, the source region 309a, channel region 308, and drain region 309b are generally formed from an initially deposited amorphous silicon (a-Si) layer that is later thermal or laser processed to form a polysilicon layer. The source, drain and channel regions 309a, 308, 309b can be formed by patterning areas on the optically transparent substrate 102 and ion doping the deposited initial a-Si layer, which is then thermally or laser processed (e.g., an Excimer Laser Annealing process) to form the polysilicon layer.

In the example depicted herein, the source region 309a, channel region 308, and drain region 309b are fabricated from IGZO (indium gallium zinc oxide) or a-IGZO (amorphous indium gallium zinc oxide) materials.

A gate insulator layer 311 is then deposited on top of the source region 309a, channel region 308, and drain region 309b to isolate a metal electrode layer 314, such as a gate electrode, disposed thereon from the channel region 308, source region 309a and drain region 309b. Additional interface or barrier layers may be optionally formed between the gate insulator layer 311 and the metal electrode layer 314 to prevent diffusion of the elements between the metal electrode layer 314 and the source, drain and channel regions 309a, 308, 309b, as desired. The gate metal electrode layer 314 is formed on top of the gate insulator layer 311. The gate insulator layer 311 is also commonly known as a gate oxide layer since it is commonly made of a silicon dioxide ($SiO_2$) layer.

In one embodiment, examples of materials that may be used as the metal electrode layer 314 include copper (Cu), gold (Au), silver (Ag), aluminum (Al), tungsten (W), molybdenum (Mo), chromium (Cr), tantalum (Ta), alloys thereof and combination thereof. In the example depicted herein, the metal electrode layer 314 is chromium (Cr) material. Furthermore, suitable materials for the gate insulator layer 311 include silicon oxide ($SiO_2$), silicon oxynitride (SiON), silicon nitride (SiN), and the like. In the example depicted therein, the gate insulator layer 311 is a silicon oxide layer.

Figure 3B:
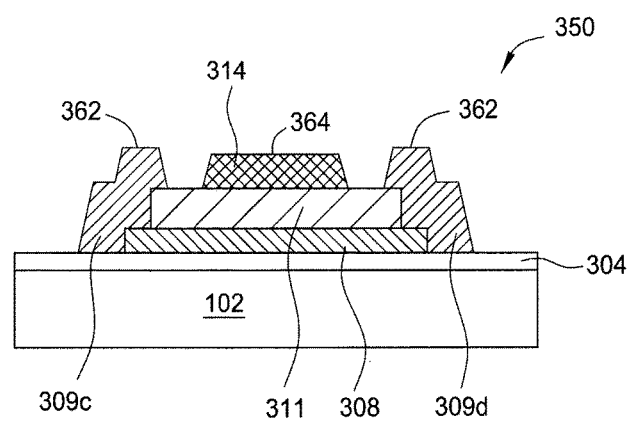
Figure 3C:
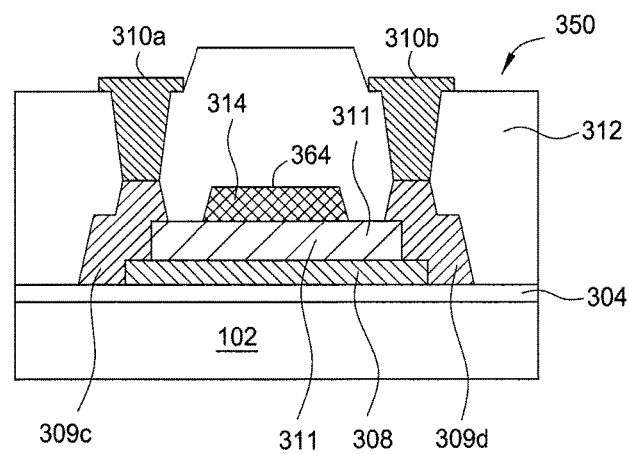

It is noted that the source region 309a and drain region 309b may be formed at a location having a distance 370 spaced apart (e.g., offset) from the metal electrode layer 314 as shown in FIG. 3A-3C as needed.

Although the example depicted in FIG. 3A is a top gate TFT device structure 350, it is noted that other types of the thin film transistor device structures, such as a bottom gate device structure with the gate electrode layer formed on a bottom of the device structure, may also be utilized to practice the present disclosure.

When the substrate 102 is transferred into the processing chamber 100 or the processing chambers 410A, 410B, 413A, 413B for a surface treatment process at operation 202, the substrate 102 including the device structure 350 in the interim stage of having the metal electrode layer 314 and the source region 309a and drain region 309b formed and exposed thereon is ready to have the surface treatment to be performed thereon in the subsequent operations.

At operation 204, a surface treatment process is performed on the substrate 102, as shown in FIG. 3A. The surface treatment process plasma remotely treats a surface 362 of the source region 309a and drain region 309b as well as a surface 364 of the metal electrode layer 314 to alter the substrate surface properties. The plasma and/or remote surface treatment process may efficiently incorporate certain elements, as shown by the arrows 360 in FIG. 3A, to react with the unsaturated bonds in the source region 309a and drain region 309b so as to improve the bonding energy at the interface with the source region 309a and drain region 309b as well as the metal electrode layer 314 and with the materials subsequently formed thereon. The surface treatment process may assist removing contaminants from the surface of the source region 309a and drain region 309b and the metal electrode layer 314, thus providing a good contact interface for the layers subsequently formed thereon. Furthermore, the surface treatment process may also be performed to modify the morphology and/or surface roughness of the surface of the source region 309a and drain region 309b as well as a surface 364 of the metal electrode layer 314 to improve the adhesion of the subsequently layers formed thereon as needed.

In one example, the surface treatment process at operation 204 may be performed by supplying a treatment gas mixture into the processing chamber, such as the processing chamber 100 depicted in FIG. 1 or the processing chamber 410A, 410B, 413A, 413B, as described in FIG. 4. The treatment gas mixture may be supplied into the processing chamber 100 with a remote plasma source 124 or to the processing chamber 410A, 410B with the remote plasma source 415A. The treatment gas mixture supplied from the remote plasma source provides a relatively gentle plasma treatment process performed to slowly treat the surfaces 362 of the source region 309a and drain region 309b as well as the surface 364 of the metal electrode layer 314 on the substrate 102 without significantly attacking the other surfaces. The gentle treatment process may gradually and slowly incorporate elements from the remote plasma into the source region 309a and drain region 309b as well as the metal electrode layer 314 to form doped/treated regions with desired film properties. The surface treatment process is performed by supplying a treatment gas mixture into the processing chamber to form a remote plasma to surface treat the source region 309a and drain region 309b as well as the metal electrode layer 314 exposed on the substrate 102.

In one embodiment, the treatment gas mixture used to treat the source region 309a and drain region 309b as well as the metal electrode layer 314 is a gas mixture including at least a fluorine containing gas. Suitable examples of the fluorine containing gas includes nitrogen trifluoride ($NF_3$) gas, $SF_6$, carbon fluorine containing gas, such as $CF_4$, $C_4F_6$, $C_4F_5$, $C_2F_2$, $CF_4$, $C_2F_6$, and $C_5F_8$, and the like. Additional gases, such as hydrogen containing gases, oxygen containing gases, or hydrogen containing gases, or inert gas including Ar and/or He, may also be added to the treatment gas mixture to enhance the treatment efficiency. Suitable examples of the oxygen containing gas include $O_2$, $N_2O$, $NO_2$, $H_2O_2$, $H_2O$, or $O_3$ as needed. Suitable examples of the nitrogen containing gas include $N_2O$, $NH_3$, $NO_2$, $N_2$, or the like. Suitable examples of the hydrogen containing gas include $H_2$, $H_2O_2$, $H_2O$ or the like.

The amount of each gas introduced into the processing chamber may be varied and/or adjusted to accommodate, for example, the depth/thickness of the elements to be incorporated into the source region 309a and drain region 309b as well as the metal electrode layer 314, the geometry of the substrate 102 being processed, the volume capacity of the plasma cavity, the volume capacity of the chamber body, as well as the capabilities of the vacuum system coupled to the chamber body from the plasma processing chamber 100.

In one example, the treatment gas mixture may be supplied to the substrate 102 from the remote plasma source 124 of the processing chamber 100. As the plasma is generated remotely in the remote plasma source 124, the reactive species dissociated from the treatment gas mixture from the remote plasma source 124 is relatively mild and gentle, so as to slowly, gently and gradually chemically react the treated regions, such as the surface 362 of the source region 309a and drain region 309b and the surface 364 of the metal electrode layer 314.

It is believed that in the remote plasma source, the nitrogen trifluoride ($NF_3$) gas is dissociated in the remote plasma source 124, forming fluorine reactive species ($F^*$ or $F^-$). Once the fluorine reactive species from the nitrogen trifluoride ($NF_3$) gas are introduced into the interior processing volume 106 of the processing chamber 100, the fluorine reactive species of nitrogen trifluoride ($NF_3$) gas may react with the loose bonding structure from the surface 362 of the source region 309a and drain region 309b and the surface 364 of the metal electrode layer 314, forming treated source region 309c and drain region 309d (e.g., fluorine-doped source region 309c and drain region 309d) from the surface 362 and/or also from the surface 364 of the metal electrode layer 314, as shown in FIG. 3B. It is noted that the depth or thickness of the treated areas to be formed in the source region 309a and drain region 309b and/or the metal electrode layer 314 may be varied based on different device requirements by performing the surface treatment process for different periods of the time. Additionally, as the source region 309a and drain region 309b may be fabricated from materials different from the metal electrode layer 314, the amount/degree of the elements from the treatment gas mixture to be incorporated thereto may or may not be the same at different places (e.g., source region 309a and drain region 309b or the metal electrode layer 314) of the substrate with different materials. In the example depicted herein, the fluorine elements from the treatment gas mixture may be efficiently and predominately incorporated into the source region 309a and drain region 309b (e.g., such as the areas formed by an IGZO material), forming the treated source region 309c and drain region 309d (e.g., fluorine-doped source region 309c and drain region 309d) on the substrate 102, as shown in FIG. 3B, while with minimum dose of elements into the metal electrode layer 314.

In one example, the gas supplied in the surface treatment gas mixture at operation 204 has at least a fluorine containing gas, such as a nitrogen trifluoride ($NF_3$) gas. Other types of gas, such as inert gases or carrier gases, may also be supplied in the treatment gas mixture to assist carrying the reactive fluorine species from the remote plasma source into the processing chamber 100. Suitable examples of the inert gas or carrier gas include at least one of Ar, He, $N_2$, $H_2$, $O_2$, $N_2O$, $NO_2$, NO, and the like. In one embodiment, the fluorine containing gas, such as a nitrogen trifluoride ($NF_3$) gas, may be supplied into the processing chamber a volumetric flow rate of between about 5 sccm/L and about 50 sccm/L. The inert or carrier gas may be supplied into the processing chamber 100 is Ar or He and $H_2$ or $N_2$ at a volumetric flow rate of between about 5 sccm/L and about 50 sccm/L. The nitrogen trifluoride ($NF_3$) gas and Ar gas supplied in the treatment gas mixture may be controlled at a flow ratio from about 1:0.01 to about 1:100, such as between about 1:0.2 and about 1:50.

While supplying the treatment gas mixture to perform the remote plasma source surface treatment process, a substrate temperature may be maintained at a range of between about 40 degrees Celsius and about 300 degrees Celsius, such as about 230 degrees Celsius. It is noted that the relatively low temperature of around 230 degrees Celsius, compared to the high temperature, e.g., about 350 degrees Celsius, in conventional practice may assist stabilizing the treated region with desired amount of dopants incorporated therein performed in a steady manner so that the treated region may be formed in a mild/gentle manner without attacking or damaging the un-treated region so as to enable a successful surface treatment or surface alternation process.

Several process parameters may be controlled while performing the surface plasma treatment process. The remote plasma power supplied to perform the surface treatment process may be controlled at between about 0.1 milliWatts/$cm^2$ and about 50 milliWatts/$cm^2$ for surface treatment process. In some examples, a RF source power may also be supplied with or without the remote plasma power while performing the surface treatment process. In one example, the RF source power may be supplied from the RF power source 122 supplied to the processing chamber 100 through the gas distribution plate 110, when processing in the processing chamber 100. It is believed that the RF source power supplied to the processing chamber 100 may assist dissociation of the gas species from the remote plasma source. In one embodiment, the RF source power may be supplied to perform the treatment process at between about 0.1 milliWatts/cm² and about 50 milliWatts/cm². The spacing may be controlled between about 400 mils and about 2000 mils. The process pressure may be controlled at between about 0.2 Torr and about 30 Torr. The process time may be controlled at a range between about 15 seconds and about 30 seconds.

It is believed that the fluorine reactive species supplied from the treatment gas mixture may be efficiently incorporated into the source region 309a and drain region 309b, forming treated, e.g., fluorine-doped, source region 309c and drain region 309d. In the example wherein the source region 309a and drain region 309b is fabricated from IGZO (indium gallium zinc oxide), the reactive fluorine species may be incorporated into the loose oxygen bonding structures from IGZO, forming metal-fluorine bonding in the IGZO materials from the source region 309a and drain region 309b. The resultant metal-fluorine bonding in the IGZO materials is believed to reduce contact resistance and IGZO resistivity by adjusting plasma treatment time, as compared to the IGZO material without fluorine surface treatment. As a result, the TFT mobility may be improved from 5.03 cm²/V·S to 6.53 cm²/V·S. The positive $V_{on}$ power is also improved from −9V to 1.5V while the negative light illumination stress is also improved from −2.42V to −0.98V, with a relatively more planar surface structure.

At operation 206, after the surface treatment process at operation 204, a deposition process may be performed to form an insulating material layer 312 may be then formed on the device structure 305, as shown in FIG. 3C. The deposition process may also be performed in a plasma processing chamber, such as the plasma processing chamber 100 depicted in FIG. 1 or the processing chamber 410A, 410B, 413A, 413B lining in the processing line, as described in FIG. 4. In such example, the surface treatment process at operation 204 and the deposition process for forming the insulating material layer 312 at operation 206 may be integrated to perform in-situ in a single chamber. Alternatively, the surface treatment process at operation 204 and the deposition process at operation 206 may be separately performed at different plasma processing chambers as needed.

Suitable of materials that may be used as the insulating material layer 312 include silicon oxide ($SiO_2$), silicon oxynitride (SiON), or silicon nitride (SiN), and the like. After the insulating material layer 312 is formed, a source-drain metal electrode layer 310a, 310b is then deposited, formed and patterned in the insulating material layer 312, as shown in FIG. 3C. After the source-drain metal electrode layer 310a, 310b is patterned and formed, a passivation layer (not shown) is then formed over the source-drain metal electrode layer 310a, 310b and on the insulating material layer 312.

Thus, the methods described herein advantageously improve the electron stability, electrical performance, film structure integration, interface management and protection of electric devices by providing an fluorine incorporated source/drain electrode layer as well as metal electrode layer between the substrate and an insulating material in the TFT device structure so as to provide enhanced interface control as well as improved electrical performance at the device structure.

While the foregoing is directed to embodiments of the present disclosure, other and further embodiments of the disclosure may be devised without departing from the basic scope thereof, and the scope thereof is determined by the claims that follow.

What is claimed is:

1. A method for forming a thin film structure with enhanced electrical performance, comprising:
   performing a surface treatment process by supplying a surface treatment gas mixture onto a substrate having source and drain regions formed and exposed thereon, wherein the surface treatment gas mixture includes at least a fluorine containing gas, and wherein the substrate further comprises a metal electrode layer disposed on a gate insulator layer formed on a contact region surrounded by the source and the drain regions; and
   providing a remote plasma power to the surface treatment gas mixture from a remote plasma source disposed in a processing chamber while performing the surface treatment process.

2. The method of claim 1, wherein the fluorine containing gas supplied in the surface treatment gas mixture is selected from a group consisting of nitrogen trifluoride ($NF_3$) gas, $SF_6$ and carbon fluorine containing gas.

3. The method of claim 1, wherein the fluorine containing gas is $NF_3$.

4. The method of claim 1, wherein performing the surface treatment process further comprises:
   incorporating fluorine elements into the source and drain regions disposed on the substrate; and
   forming fluorine-doped source and drain regions.

5. The method of claim 1, wherein the surface treatment gas mixture further comprises an oxygen containing gas or an inert gas.

6. The method of claim 1, wherein the source and the drain regions are disposed at a location offset from the metal electrode layer.

7. The method of claim 1, further comprising:
   forming an insulating material layer on the fluorine-doped source and drain regions and on the metal electrode layer in the processing chamber where the surface treatment process is performed.

8. The method of claim 1, wherein the source and drain regions are fabricated from a material selected from a group consisting of a-IGZO (amorphous indium gallium zinc oxide), IGZO, InGaZnON, ZnO, ZnON, ZnSnO, CdSnO, GaSnO, TiSnO, CuAlO, SrCuO, LaCuOS, GaN, InGaN, AlGaN and InGaAlN.

9. The method of claim 6, wherein the insulating material and the gate insulator layer are silicon oxide layers.

10. A method for forming a thin film structure with enhanced electrical performance, comprising:
    performing a surface treatment process on a substrate having source and drain regions formed and exposed thereon, wherein the source and drain regions are fabricated by IGZO material, wherein the substrate further comprises a metal electrode layer disposed on a gate insulator layer formed on a contact region surrounded by the source and the drain regions, and wherein performing the surface treatment process comprising:

supplying a surface treatment gas mixture into a processing chamber where the substrate is disposed into;

applying a remote plasma power to the surface treatment gas mixture supplied to the processing chamber to form a remote plasma in the processing chamber to incorporate fluorine elements into the source and drain regions; and forming fluorine-doped source and drain regions on the substrate.

\* \* \* \* \*

UNITED STATES PATENT AND TRADEMARK OFFICE
CERTIFICATE OF CORRECTION

PATENT NO. : 10,224,432 B2
APPLICATION NO. : 15/456418
DATED : March 5, 2019
INVENTOR(S) : Rodney Shunleong Lim et al.

It is certified that error appears in the above-identified patent and that said Letters Patent is hereby corrected as shown below:

In the Specification

Column 9, Line 35, delete "$C_4F_5$," and insert -- $C_4F_8$, --, therefor.

In the Claims

Column 12, Line 54, Claim 8, delete "InGaAIN." and insert -- InGaAlN. --, therefor.

Signed and Sealed this
Seventh Day of May, 2019

Andrei Iancu
*Director of the United States Patent and Trademark Office*